United States Patent

[11] 3,617,915

[72] Inventors Kiyoshi Amemiya
Yokohama;
Kazuhiko Yamazaki, Fujisawa, both of
Japan

[21] Appl. No. 50,187
[22] Filed June 26, 1970
[45] Patented Nov. 2, 1971
[73] Assignee Hitachi, Ltd.
Tokyo, Japan
[32] Priority June 29, 1969
[33] Japan
[31] 44/51135

[54] TUNING CIRCUIT HAVING A NEUTRALIZING CIRCUIT
2 Claims, 2 Drawing Figs.

[52] U.S. Cl. .......... 330/27, 330/79, 334/15
[51] Int. Cl. .......... H03f 1/14
[50] Field of Search .......... 330/27, 79; 334/15, 56

[56] References Cited
UNITED STATES PATENTS
3,528,021 9/1970 Okasaki .......... 330/27

*Primary Examiner*—Roy Lake
*Assistant Examiner*—James B. Mullins
*Attorney*—Craig, Antonelli, Stewart & Hill ABSTRACT: An electronic tuning circuit comprising a serial circuit of a high-frequency band tuning coil and a low-frequency band tuning coil for tuning with broadcast waves having channels in the high- and low-frequency bands, the serial circuit being connected with an amplifier element, whereby during the tuning with the high-frequency band the low-frequency band tuning coil is AC grounded and a first neutralizing condenser is connected between the input terminal of the amplifier element and a coil electromagnetically coupled to the high-frequency band coil to thereby feed back the output signal of the amplifier element to the input, and during the tuning with the low-frequency band the low frequency band tuning coil produces an output signal which is fed back to the input through a second neutralizing condenser.

INVENTOR
KIYOSHI AMEMIYA
KAZUHIKO YAMAZAKI
BY Craig, Antonelli, Stewart & Hill
ATTORNEYS

TUNING CIRCUIT HAVING A NEUTRALIZING CIRCUIT

BACKGROUND OF THE INVENTION

Field of the Invention

This invention generally relates to a tuning circuit having a neutralizing circuit, and more particularly to an electronic tuning circuit using a variable capacity diode for receiving broadcast waves having channels in the high and low-frequency bands.

DESCRIPTION OF THE PRIOR ART

In general, if an active element such as triode, transistor or the like is used for high-frequency amplification, a positive feedback from output to input occurs due to the internal feedback capacity of that element and results not only in unstable operation of the element but also in oscillation thereof. To prevent this, a neutralizing circuit has heretofore been provided to negate the feedback current resulting from the internal capacity of the active element. For example, a bridge-type neutralizing circuit as will be described has been used in the variable inductance type VHF (very high frequency) television tuner according to the prior art. In the variable-inductance-type tuner where the channel changeover is accomplished by varying the inductance, no variation occurs in the capacity of the tuning circuit. Thus, stable neutralization can be attained throughout all channels and accordingly there is obtained a highly stable amplification characteristic as a tuning circuit. However, in an electronic tuning circuit where the channel tuning is accomplished by varying the capacity of the variable capacity diode, the tuning capacity of the tuning circuit is varied to disable the stable neutralization as will be described later. The neutralizing capacity is predetermined, and therefore, in receiving broadcast waves having channels in the high and low-frequency bands, neutralization will be especially insufficient if the tuning is directed to the high-frequency channels and excessive if the tuning is directed to the low-frequency channels, thus resulting in oscillation or the like of the circuit depending upon the value of the neutralizing capacity. This means the inability to provide a stable tuning circuit.

SUMMARY OF THE INVENTION

An object of the present invention is to provide an electronic tuning circuit which can accomplish a substantially uniform neutralization for any of the high-frequency band and the low-frequency band.

Another object of the present invention is to provide an electronic tuning circuit which can provide a sufficient power gain.

To achieve these objects, the electronic tuning circuit of the present invention comprises an amplifier element, a serial connection of a high-frequency band tuning coil connected with the output of the amplifier element, means for substantially disconnecting the low-frequency band tuning coil from the high-frequency band tuning coil during the reception of the high-frequency band, a circuit including a serial circuit of a coil electromagnetically coupled to the high-frequency band tuning coil and a first neutralizing condenser, to thereby feed back the output signal of the amplifier element to an input terminal through the serial circuit to effect the tuning with the high-frequency band, and a circuit for feeding back the signal voltage of the low-frequency band tuning coil to the input terminal through a second neutralizing condenser to effect tuning with the low-frequency band.

DESCRIPTION OF THE PREFERRED EMBODIMENTS

Figure 1:
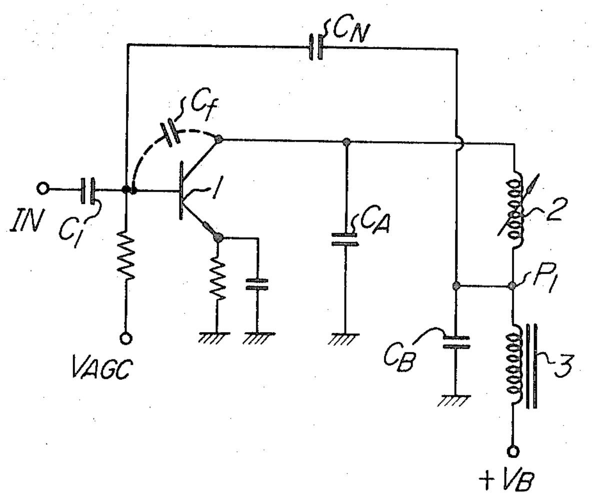
FIG. 1 PRIOR ART
FIG. 1 is a diagram showing the tuning circuit for changing over the channels by using a variable inductance according to the prior art.

Referring to FIG. 1, high-frequency signals are applied from an input terminal IN through a DC component blocking condenser $C_1$ to the base of an amplifier transistor 1. A tuning condenser $C_A$ and a tuning coil 2 are connected in parallel with the collector of the transistor 1. A source voltage $V_B$ is applied to one end of the tuning coil 2 through a choke coil 3, which is connected with the coil 2 at a point $p_1$. A phase inverting condenser $C_B$ is connected between the connection point $P_1$ and the ground, and a neutralizing condenser $C_N$ is connected between the connection point $P_1$ and the base of the transistor 1. $C_f$ represents the internal feedback capacity of the transistor 1 and $V_{AGC}$ represents an automatic gain control voltage applied to the base of the transistor 1.

In the tuning circuit thus constructed, the neutralizing circuit constitutes a bridge circuit, whose neutralizing capacity $C_N$ is expressed as:

$$C_N = C_f C_B / C_A \qquad (1)$$

In a tuning circuit where the channel changeover is effected by a variable inductance, the neutralizing circuit always satisfies equation (1) in spite of the varying inductance (the equation includes no inductance component), and therefore a stable amplification characteristic is provided throughout all channels.

However, in an electronic tuning circuit where the channel changeover is effected by varying the capacity $C_A$ of the tuning condenser, the neutralizing capacity $C_N$ is usually made constant and this allows equation (1) to be satisfied only for specific channels, thus making it difficult to provide neutralization throughout all channels. Especially, the high-frequency band has a number of channels and accordingly requires a wide range of frequency variation. Thus, the variation range of the tuning capacity $C_A$, for example, must be great enough to range from 6.5 to 10.5 pF, and this leads to a difficulty in selecting the neutralizing capacity. For example, if the capacity $C_A$ is set to a channel in the intermediate frequency band, neutralization will be insufficient for the tuning with the high-frequency channels and excessive for the tuning with the low-frequency channels. This is the reason why the usual electronic tuner does not employ a neutralizing circuit but uses emitter grounding. However, this results in the disadvantage of insufficient gain.

Figure 2:
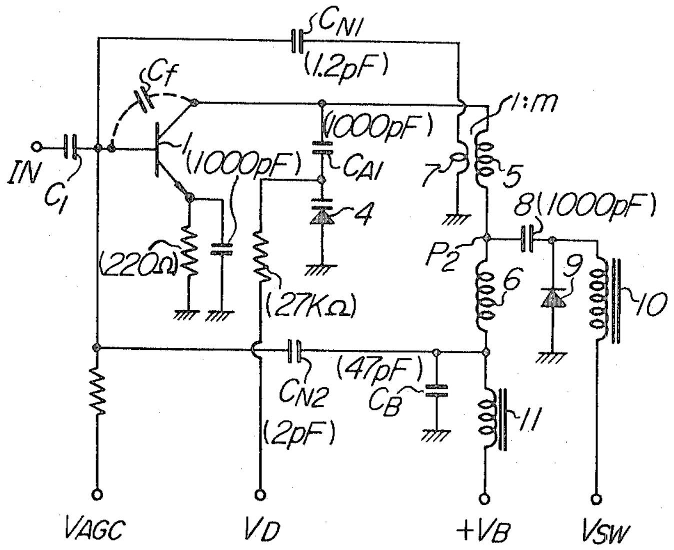
FIG. 2 is a diagram showing an embodiment of the tuning circuit according to the present invention.

Referring to FIG. 2, there is shown a tuning circuit according to an embodiment of the present invention. The circuit includes an amplifier transistor 1 having an internal feedback capacity $C_f$. An input terminal IN is connected with the base of the transistor 1 through a DC component blocking condenser $C_1$. There are neutralizing condensers $C_{N1}$ and $C_{N2}$ whose capacities are also represented by $C_{N1}$ and $C_{N2}$ respectively. The tuning capacity is provided by a serial circuit of a condenser $C_{A1}$ and a variable capacity tuning diode 4. Channel changeover is accomplished by varying a voltage $V_D$ applied to the tuning diode 4 and thereby varying the capacity of that diode.

In parallel with the tuning capacity (consisting of condenser $C_{A1}$ and diode 4), there is connected a serial circuit of a high-frequency band tuning coil 5 and a low-frequency band tuning coil 6 so as to constitute an output tuning circuit. A DC voltage $V_B$ is applied to the serial circuit of tuning coils 5 and 6 through a choke coil 11. A phase inverting condenser is designated by $C_B$. A coil 7 is electromagnetically coupled to the high-frequency band tuning coil 5 to positively feed back output signals to the base of the transistor 1 trough the neutralizing condenser $C_{N1}$. The high and low-frequency band tuning coils 5 and 6 are connected together at a point $P_2$. A switching diode 9 is inserted between the connection point $P_2$ and the ground through the DC component blocking condenser 8. Changeover between the high and low-frequency bands is accomplished by applying a switch signal $V_{SW}$ to the switching diode 9 through a choke coil 10 to thereby ground or open, with respect to AC component (hereinafter referred to as "AC grounded" or "AC opened"), the connection point $P_2$ between the high and low-frequency tuning coils 5 and 6.

In such an arrangement, neutralization is effected by the coil 7 coupled to the high-frequency band tuning coil 5 and the neutralizing condenser $C_{N1}$ when the high-frequency band is received or when the connection point $P_2$ is AC grounded, and neutralization is effected by the phase inverting condenser $C_B$ (whose capacity is represented by $C_B$) and neutralizing condenser $C_{N2}$ when the low-frequency band is received or when the connection point $P_2$ is AC opened. More particularly, only the high-frequency band tuning coil 5 acts as a tuning coil when the high-frequency band is received. If the number of turns of the high frequency band tuning coil 5 and that of the coil 7 are at a ratio of $m$:1, then the neutralizing capacity $C_{N1}$ will be expressed as:

$$C_{N1}=m\cdot C_f \qquad (2)$$

From this equation it is seen that the tuning capacity for the channel changeover (i.e. the combined capacity of the condenser $C_{A1}$ and diode 4) becomes independent of the neutralizing circuit during the reception of the high-frequency band, whereby there is provided a tuning circuit which stably operates for such reception. Since at this time the other neutralizing condenser $C_{N2}$ is grounded through the phase-inverting condenser $C_B$, the capacity of the neutralizing condenser $C_{N2}$ is connected with the input terminal IN but this does not interfere with the high-frequency band reception because the capacity $C_{N2}$ is small.

When the low-frequency band is received, the tuning coils 5 and 6 are connected in series with a result that the coil 7 coupled solely to the tuning coil 5 provides a sufficiently small neutralizing voltage, which means a small neutralizing effect.

On the other hand, a bridge-type neutralizing circuit is constituted by internal feedback capacity $C_f$, tuning capacity $C_{AB}$, neutralizing capacity $C_{N2}$ and capacity $C_B$ of the phase-inverting condenser. As a result, the tuning capacity $C_{N2}$ during the reception of the low-frequency band is expressed as:

$$C_{N2}=C_f \qquad 3)$$

In this equation, the tuning capacity $C_{AB}$ is variable because the capacity of the tuning diode 4 is variable with the channel changeover. Thus, neutralization cannot be effected sufficiently because the tuning capacity $C_{N2}$ is made constant. However, the number of channels received in the low-frequency band is much smaller than that in the high-frequency band, and accordingly the frequency variation range for the reception of the low-frequency band is small, which means a small variation in the tuning capacity $C_{AB}$. Thus, equation (3) is substantially satisfied throughout all channels in the low-frequency band and there is provided sufficient neutralization for practical purposes.

We claim:

1. An electronic tuning circuit comprising:
a. an amplifier element having an input and an output terminal;
b. a tuning circuit connected with said output terminal of said amplifier element, said tuning circuit comprising a variable tuning capacity and a serial circuit of a high-frequency band tuning coil and a low-frequency band tuning coil connected in parallel with said variable tuning capacity;
c. means for AC grounding the connection point between said high and low-frequency band tuning coils during the reception of the high-frequency band;
d. means including a first neutralizing condenser and a coil electromagnetically coupled to said high-frequency band tuning coil to thereby feed back a voltage produced by said electromagnetically coupled coil to said input terminal of said amplifier element through said first neutralizing condenser; and
e. means including a second neutralizing condenser and means for phase inverting the output voltage of said low-frequency band tuning coil to thereby feed back the output of said phase-inverting means to said input terminal of said amplifier element through said second neutralizing condenser.

2. An electronic tuning circuit comprising:
a. a transistor having input signals applied to the base thereof;
b. a tuning circuit connected with the collector of said transistor, said tuning circuit comprising a tuning capacity including a variable capacity diode, and a serial circuit of a high-frequency band tuning coil and a low-frequency band tuning coil connected in parallel with said capacity;
c. a serial circuit of a condenser and a switching diode connected between the connection point of said high and low-frequency band tuning coils and the ground to thereby AC ground said connection point during the reception of the high-frequency band, said diode having a switching voltage applied thereto;
d. a coil electromagnetically coupled to said high-frequency band tuning coil;
e. a first neutralizing condenser connected between said electromagnetically coupled coil and the base of said transistor;
f. a phase-inverting condenser connected with said low-frequency band tuning coil; and
g. a second neutralizing condenser connected between said phase-inverting condenser and the base of said transistor.

* * * * *